(12) United States Patent
Burr et al.

(10) Patent No.: US 8,633,444 B2
(45) Date of Patent: Jan. 21, 2014

(54) EFFICIENT AND SERVICEABLE LIGHT GUIDE FOR PET DETECTOR

(75) Inventors: Kent C. Burr, Buffalo Grove, IL (US); Daniel Gagnon, Twinsburg, OH (US); Zhengyan Wang, Antioch, IL (US)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 242 days.

(21) Appl. No.: 13/153,021

(22) Filed: Jun. 3, 2011

(65) Prior Publication Data

US 2012/0305782 A1 Dec. 6, 2012

(51) Int. Cl.
*G01T 1/164* (2006.01)

(52) U.S. Cl.
USPC ..................... 250/363.03; 250/368

(58) Field of Classification Search
USPC ..................................... 250/363.03
See application file for complete search history.

(56) References Cited

U.S. PATENT DOCUMENTS

| | | | | |
|---|---|---|---|---|
| 4,982,096 A | * | 1/1991 | Fujii et al. | 250/367 |
| 5,059,798 A | | 10/1991 | Persyk | |
| 5,652,429 A | * | 7/1997 | Genna | 250/368 |
| 6,015,974 A | * | 1/2000 | Genna | 250/368 |
| 7,244,942 B2 | * | 7/2007 | Andreaco et al. | 250/367 |
| 2007/0210259 A1 | * | 9/2007 | Kerwin et al. | 250/370.11 |
| 2008/0237477 A1 | * | 10/2008 | Hoggatt et al. | 250/368 |

FOREIGN PATENT DOCUMENTS

WO   WO 2010041191 A2 *   4/2010

OTHER PUBLICATIONS

A. Kuhn, et al. "Design of a Lanthanum Bromide Detector for Time-of-Flight Pet" Issued Oct. 2004, IEEE Transactions on Nuclear Science, vol. 51, No. 5, pp. 2550-2557.

Chang L. Kim, et al. "High Spatial Resolution Detector Using an 8×8 MLS Crystal Array and a Quad Anode Photo-Multiplier" Issued Nov. 2002, Nuclear Science Symposium Conference Record, 2002 IEEE, vol. 3, pp. 1665-1669.

* cited by examiner

*Primary Examiner* — David Porta
*Assistant Examiner* — Jeremy S Valentiner
(74) *Attorney, Agent, or Firm* — Oblon, Spivak, McClelland, Maier & Neustadt, L.L.P.

(57) ABSTRACT

A positron emission tomography (PET) detector module includes an array of scintillation crystal elements and a plurality of photosensors arranged to at least partially cover the array of scintillation crystal elements. The photosensors are configured to receive light emitted from the array of scintillation crystal elements. The module includes a transparent adhesive arranged between the array of scintillation crystal elements and the plurality of photosensors. The transparent adhesive extends directly from a surface of at least one of the scintillation crystal elements to a surface of at least one of the photosensors and is configured to distribute the light emitted from one of the scintillation crystal elements to more than one of the photosensors. A method of manufacturing the module includes various steps utilizing a fixture. A PET scanner uses multiple modules arranged circumferentially around an area to be scanned.

20 Claims, 17 Drawing Sheets

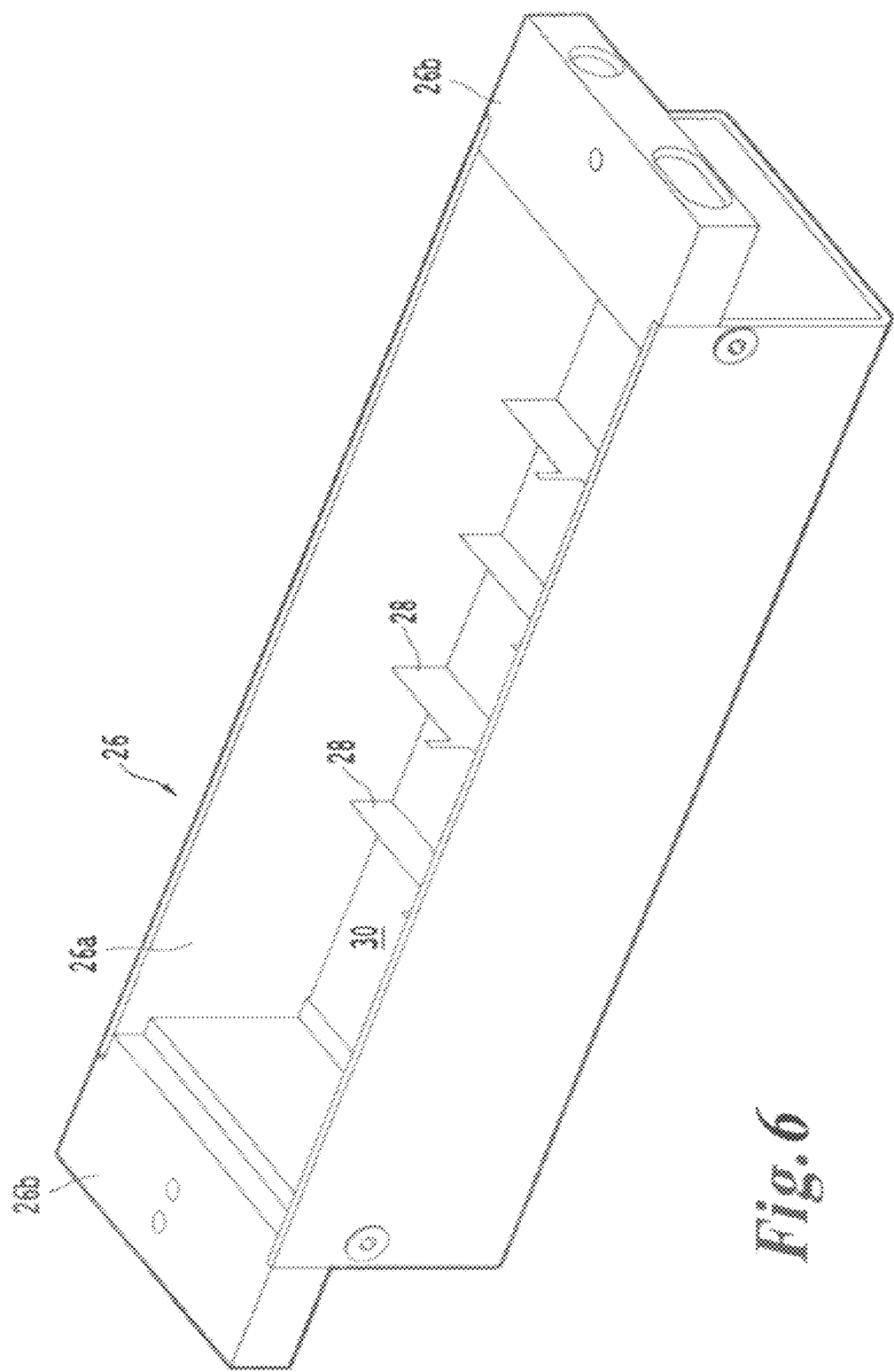

EFFICIENT AND SERVICEABLE LIGHT GUIDE FOR PET DETECTOR

FIELD

Embodiments described herein relate generally to the design of radiation detectors, such as for gamma cameras and positron emission tomography (PET) scanners.

BACKGROUND

In typical PET imaging, a radiopharmaceutical agent is introduced into an object to be imaged via injection, inhalation, or ingestion. After administration of the radiopharmaceutical, the physical and bio-molecular properties of the agent cause it to concentrate at specific locations in the human body. The actual spatial distribution of the agent, the intensity of the region of accumulation of the agent, and the kinetics of the process from administration to its eventual elimination are all factors that may have clinical significance. During this process, a positron emitter attached to the radiopharmaceutical agent will emit positrons according to the physical properties of the isotope, such as half-life, branching ratio, etc.

The radionuclide emits positrons, and when an emitted positron collides with an electron, an annihilation event occurs, wherein the positron and electron are destroyed. Most of the time, an annihilation event produces two gamma rays (at 511 keV) traveling at substantially 180 degrees apart.

By detecting the two gamma rays, and drawing a line between their locations, i.e., the line-of-response (LOR), one can determine the likely location of the original disintegration. While this process will only identify a line of possible interaction, by accumulating a large number of those lines, and through a tomographic reconstruction process, the original distribution can be estimated. In addition to the location of the two scintillation events, if accurate timing (within few hundred picoseconds) is available, a time-of-flight (TOF) calculation can add more information regarding the likely position of the event along the line. Limitations in the timing resolution of the scanner will determine the accuracy of the positioning along this line. Limitations in the determination of the location of the original scintillation events will determine the ultimate spatial resolution of the scanner, while the specific characteristics of the isotope (e.g., energy of the positron) will also contribute (via positron range and co-linearity of the two gamma rays) to the determination of the spatial resolution the specific agent.

The above described detection process must be repeated for a large number of annihilation events. While each imaging case must be analyzed to determine how many counts (i.e., paired events) are required to support the imaging task, current practice dictates that a typical 100-cm long, [18]FDG (fluoro-deoxyglucose) study will need to accumulate several hundred million counts. The time required to accumulate this number of counts is determined by the injected dose of the agent and the sensitivity and counting capacity of the scanner.

PET imaging systems use detectors positioned across from one another to detect the gamma rays emitting from the object. Typically a ring of detectors is used in order to detect gamma rays coming from each angle. Thus, a PET scanner is typically substantially cylindrical to be able to capture as much radiation as possible, which should be, by definition, isotropic.

Once the overall geometry of the PET scanner is known, another challenge is to arrange as much scintillating material as possible in the gamma ray paths to stop and convert as many gamma rays as possible into light. In order to be able to reconstruct the spatio-temporal distribution of the radio-isotope via tomographic reconstruction principles, each detected event will need to be characterized for its energy (i.e., amount of light generated), its location, and its timing. Most modern PET scanners are composed of several thousand individual crystals, which are arranged in modules and are used to identify the position of the scintillation event. Typically crystal elements have a cross section of roughly 4 mm×4 mm. Smaller or larger dimensions and non-square sections are also possible. The length or depth of the crystal will determine how likely the gamma ray will be captured, and typically ranges from 10 to 30 mm. One example of a scintillation crystal is LYSO (or $Lu_{1.8}Y_{0.2}SiO_5$:Ce or Lutetium Orthosilicate), which is chosen for its high light output, fast rise time, fast decay time, high average atomic number, and high density. Other crystals can be used.

FIG. 3 shows a conventional PET detector module in which a photomultiplier tube (PMT) 20 is coupled to a discrete light guide 15 using RTV, wherein "RTV" means "room-temperature-vulcanized (vulcanizable)" and is typically used to denote RTV silicone. The discrete light guide 15 is typically formed from poly(methyl methacrylate) "PMMA." The PMMA light guide 15 is coupled by first RTV 34 to an array of scintillation crystal elements 30. The light guide 15 is coupled to the PMTs 20 by a second RTV 36. The first RTV 34 and second RTV 36 may be the same material or different materials. The array of scintillation crystal elements 30 receive gamma rays that are transmitted from the patient or object and convert the gamma rays into light. The light is then transmitted, via the light guide 15 to the PMTs 20. Thus, a gamma ray created within a patient or other object disposed within the ring of the PET scanner 1 ultimately passes through the scintillation crystal elements, which in turn produce light that is detected by the PMTs 20.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a perspective view of a tray, which is a component of the PET detector module depicted in FIG. 4 as well as the PET detector modules depicted in FIGS. 5A and 5B, along with scintillator array segments, and reflector elements between scintillator segments;

DETAILED DESCRIPTION

Figure 1:
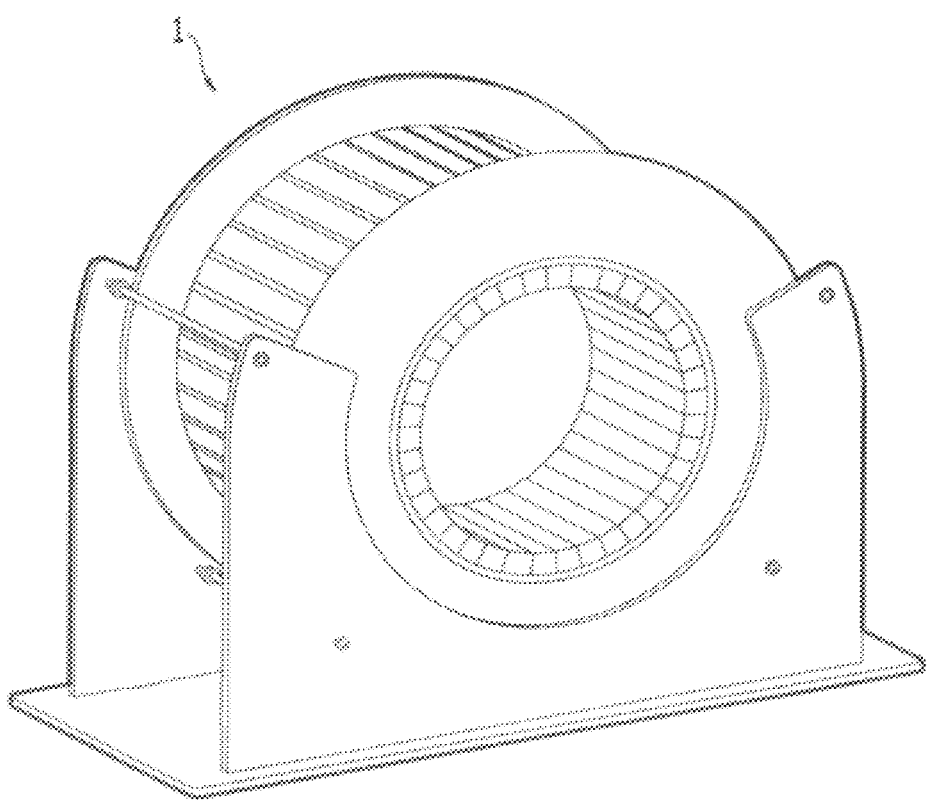
FIG. 1 is a perspective view of a PET scanner according to one example of a preferred embodiment disclosed herein.

One aspect of the disclosed embodiments provides a reduction in complexity and cost of manufacturing the modules that hold the scintillation crystals. This benefit is achieved by using a transparent adhesive as a significant or sole component that acts to distribute light from one or more crystals to a plurality of photosensors. In this regard the thickness of the transparent adhesive is determined based on its light distribution properties. In other words, the thickness is set to optimize light distribution to the plurality of sensors.

Typically, an adhesive is used to attach a PMT to a scintillator or a plurality of scintillators. The thickness of the adhesive used to attach a PMT (or any component) to a scintillator is typically kept thin. However, the present inventors have found that the transparent adhesive may be used to distribute light from one or more of the scintillators to multiple PMTs if the adhesive is made sufficiently thick. In other words, the transparent adhesive can serve two purposes (i) to adhere the PMTs to the scintillation crystals and (ii) to distribute the light from the scintillator(s) to multiple PMTs. While use of an adhesive merely to adhere the PMTs to scintillator crystals preferably involves a thickness of an adhesive of about 0.5 mm or less in order to conserve adhesive, allow quick curing, and to increase strength; providing a thickness of about 1 mm or more will, depending on the size of the PMTs and scintillator crystals, provide sufficient distribution of the light from one scintillator crystal to multiple PMTs if the light is not obstructed or disrupted by other components disposed between the scintillator crystal and the PMTs. Further, as the size and shape of the PMTs affects the required thickness for proper distribution of light, the thickness of the transparent adhesive between the PMT and scintillation crystals may be defined as a percentage of a dimension of a bottom surface of the PMTs. For example, the percentage may be set forth as a percentage of a radius or a percentage of a greatest width dimension of the bottom surface.

Another aspect of the disclosed embodiments is to provide a module for holding scintillation crystals. This aspect includes the elimination of certain physical structure from conventional modules in order to provide a relatively convenient arrangement that is, in some cases, easily serviceable with minimal loss of material.

Embodiments described herein relate to a new method and apparatus to guide the maximum amount of light from the scintillation crystals to an array of photosensors.

In one embodiment, a positron emission tomography (PET) detector module includes an array of scintillation crystal elements and a plurality of photosensors arranged to at least partially cover the array of crystal elements. The photosensors are configured to receive light emitted from the array of crystal elements. A transparent adhesive is arranged between the array of scintillation crystal elements and the plurality of photosensors. The transparent adhesive extends directly from a surface of at least one of the scintillation crystal elements to a surface of at least one of the photosensors and is configured to distribute the light emitted from the scintillation crystal element to the plurality of photosensors.

In one example, the photosensors are circular, and the transparent adhesive, as measured in a direction extending from the photosensor to the scintillation crystal element, has a thickness preset to be a particular percentage of the length of the radius of the photosensor. In one example, the percentage is 5% of the length of the radius of the at least one photosensor.

In one embodiment, a positron emission tomography (PET) scanner system includes a plurality of detector modules arranged adjacent to one another to form a cylindrical detector ring. Each of the detector modules includes an array of scintillation crystal elements, a plurality of photosensors arranged to at least partially cover the array of crystal elements and configured to receive light emitted from the array of crystal elements, and a transparent adhesive arranged between the array of scintillation crystal elements and the plurality of photosensors. The transparent adhesive extends directly from a surface of at least one of the scintillation crystal elements to a surface of at least one of the photosensors and is configured to distribute the light emitted from the scintillation crystal element to the plurality of photosensors. This arrangement provides a relatively simple configuration of parts and can typically be manufactured more quickly and reliably than conventional PET scanner systems.

Another embodiment disclosed herein provides a method of manufacturing a positron emission tomography (PET) detector module. The method includes (1) disposing at least one photosensor in a position offset from an array of scintillation crystal elements so as to form a gap between the at least one photosensor and the array of scintillation elements, and (2) discharging a flowable transparent adhesive into the gap such that the flowable transparent adhesive extends directly from a surface of the at least one photosensor to a surface of the array of scintillation elements.

Another embodiment disclosed herein provides a method of manufacturing a positron emission tomography (PET) detector module. The method comprises (1) providing a plurality of scintillation crystal elements, (2) disposing a plurality of photosensors a predetermined distance from the plurality of scintillation crystal elements, and (3) bridging the predetermined distance with a flowable transparent adhesive.

These methods are typically cheaper and simpler than conventional methods of manufacturing PET detector modules. In general, these methods require fewer parts than conventional PET detector manufacturing methods.

FIG. 1 depicts a general arrangement of PET scanner in which a patient, animal, or object may be inserted within the open space, i.e., ring, created by the various PET detector modules.

Figure 2:
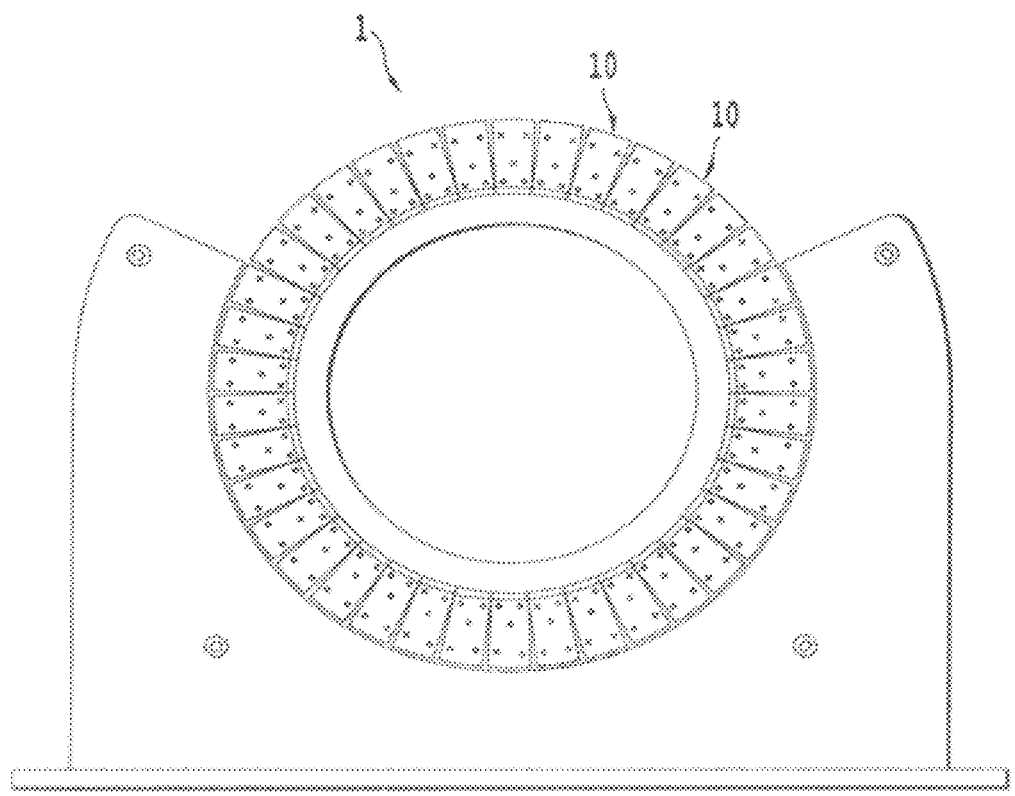
FIG. 2 is a front view of the PET scanner depicted in FIG. 1.

FIG. 2 depicts a front view of the PET scanner shown in FIG. 1. In this view, the individual PET detector modules 10 can be clearly seen as arranged circumferentially around an open space in which a patient or other object may be scanned. The PET detector modules 10 typically all face toward a center of the ring, and a direction defined by a radius extending from the center of the ring through any of the PET detector modules 10 is shown as the vertical direction in the remaining drawings.

Figure 3:
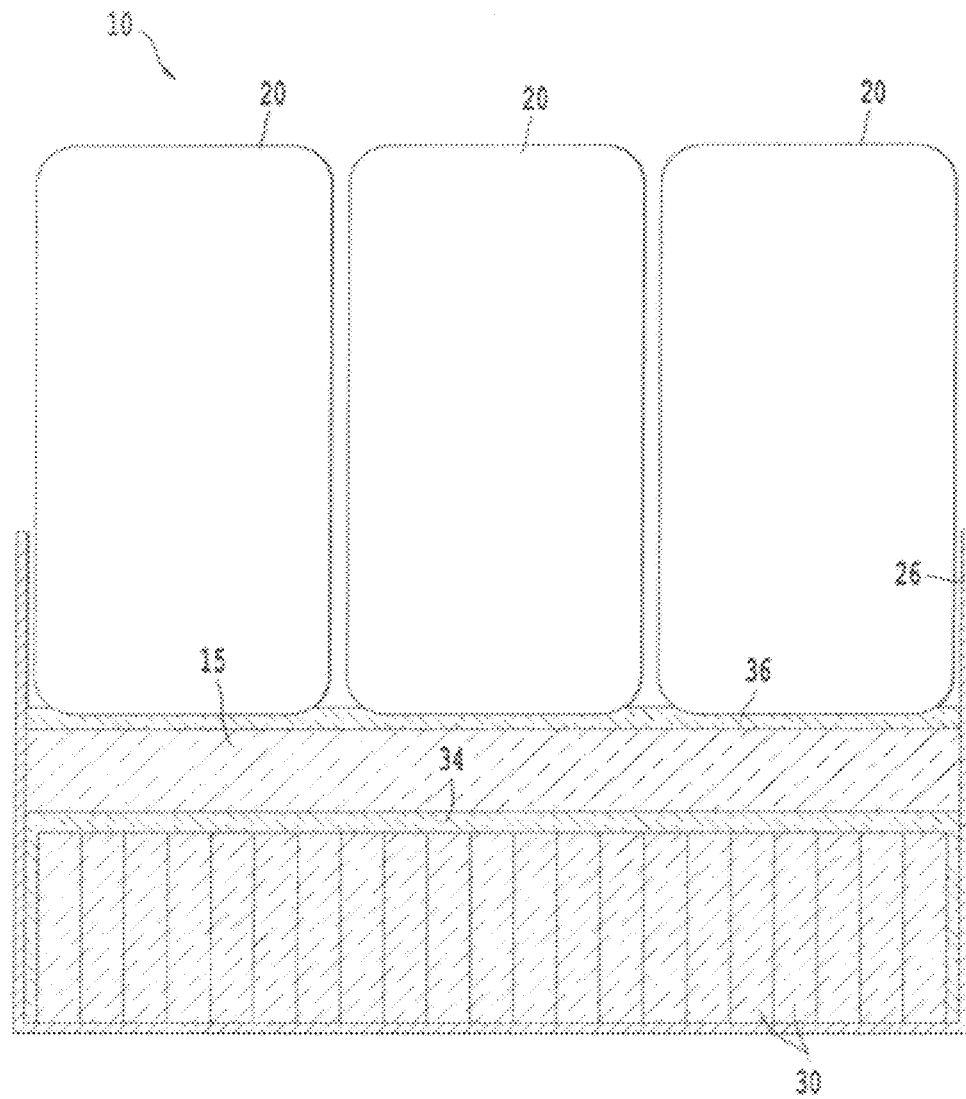
FIG. 3 is a background figure depicting a front view of a conventional PET detector module.
Figure 4:
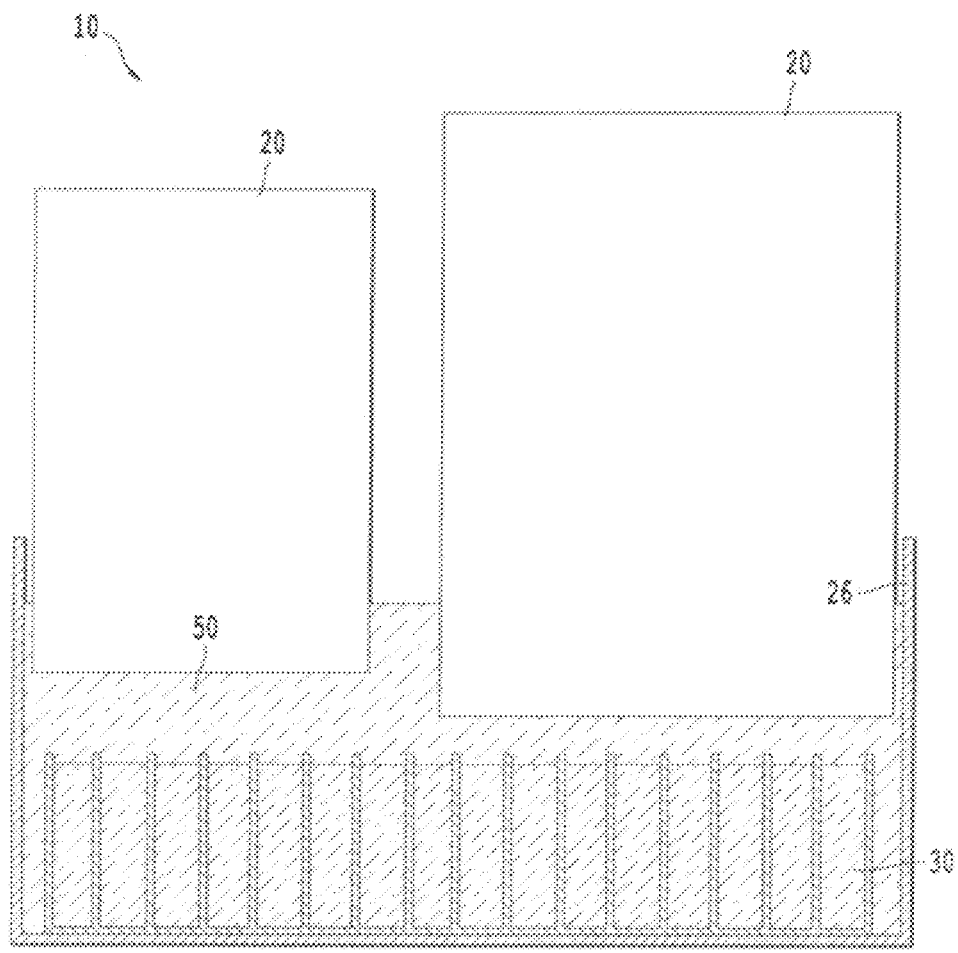
FIG. 4 is a front view of a PET detector module according to one example of an embodiment disclosed herein.

FIG. 4 depicts an example of a PET detector module 10 according to one non-limiting embodiment. In contrast to the arrangement shown in FIG. 3, the PMTs 20 shown in FIG. 4 are directly disposed upon a transparent adhesive 50. The transparent adhesive directly connects surfaces of the PMTs 20 with surfaces of the scintillation crystals 30. By "directly connects," the description above means there is a direct line-of-sight pathway from at least one of the PMTs 20 to at least one the scintillation crystals 30 along which line-of-sight pathway only transparent adhesive 50 is present. Thus, the embodiment shown in FIG. 4 omits the separate (discrete) light guide component 15 of the PET detector module 10 shown in FIG. 3. One benefit of the above-noted arrangement is that construction of the PET detector module is significantly simplified. Additionally, in some embodiments, the transparent adhesive 50 is easily removable. For example, the transparent adhesive 50 may be a silicone elastomer. For example, one embodiment disclosed herein uses Dow Corning and Sylgard 184 Silicone Elastomer™ for the transparent adhesive 50, and another example includes GE RTV615™. An additional example of a transparent adhesive usable with embodiments discussed herein is Shin-Etsu KE420™. Some embodiments discussed herein use heat-cured or ultraviolet (UV)-cured adhesives. One example of a (UV)-cured transparent adhesive usable with the disclosed embodiments is Dymax OP-20. Other transparent adhesives are possible for use as the transparent adhesive 50.

In contrast to conventional modules, the transparent adhesive 50 in some embodiments discussed herein is used to guide or distribute a majority of the light to the PMTs 20, and thus the use of a separate light guide such as the one described in FIG. 3 can be reduced or eliminated. Additionally, when a removable transparent adhesive 50 is used, especially when the adhesive is removable without using power tools, it is possible to easily replace the PMTs 20 for maintenance or to obtain different operational characteristics from the PET scanner 1.

In order to use the transparent adhesive 50 to distribute light to the PMTs, i.e., share the light, it is beneficial for the transparent adhesive 50 to have a predetermined thickness specifically selected for this purpose and function. In one example, the transparent adhesive 50 is provided with a thickness of at least one millimeter in order to provide adequate sharing of the light. In another example, the thickness of the transparent adhesive 50 is determined based on a dimension of the PMT 20. For example, as measured in the horizontal direction, i.e., transverse to the direction of transmission of gamma rays, which is the radial direction shown in FIG. 2, the PMTs 20 have a width. In many cases, the PMTs 20 are circular or cylindrical, and the width of the PMTs measured in the horizontal direction (as shown in FIG. 4) is the diameter. In one embodiment discussed herein, the thickness of the transparent adhesive 50 is no less than 10% of the width of the PMT 20 in an area in contact with the transparent adhesive 50. In another example, the thickness of the adhesive as measured in the direction of the radius of the PMT 20 shown in FIG. 2 is no less than 5% of the length of the radius of the PMT 20. In one embodiment discussed herein, the thickness of the transparent adhesive 50 is from 90% to 100% of the length of the radius of the PMT 20.

Figure 5A:
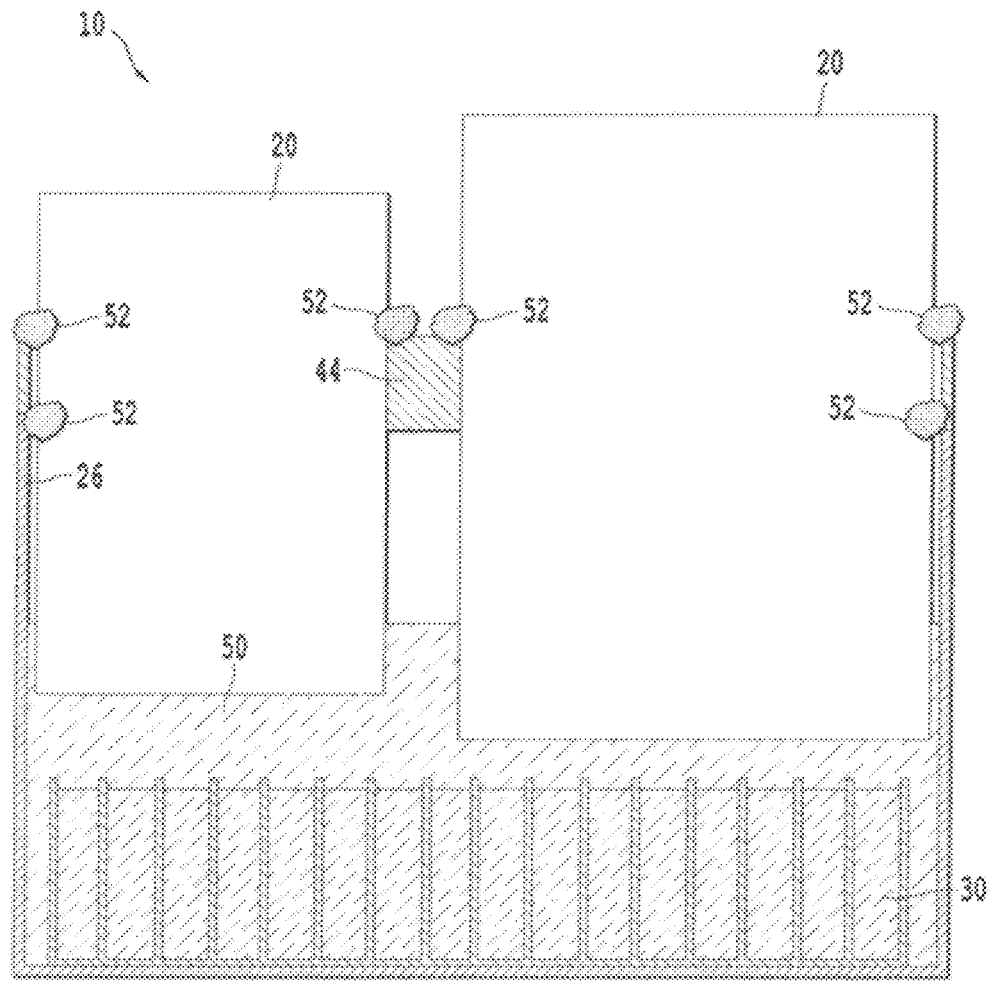
FIG. 5A is a front view of a PET detector module according to another example disclosed herein.
Figure 5B:
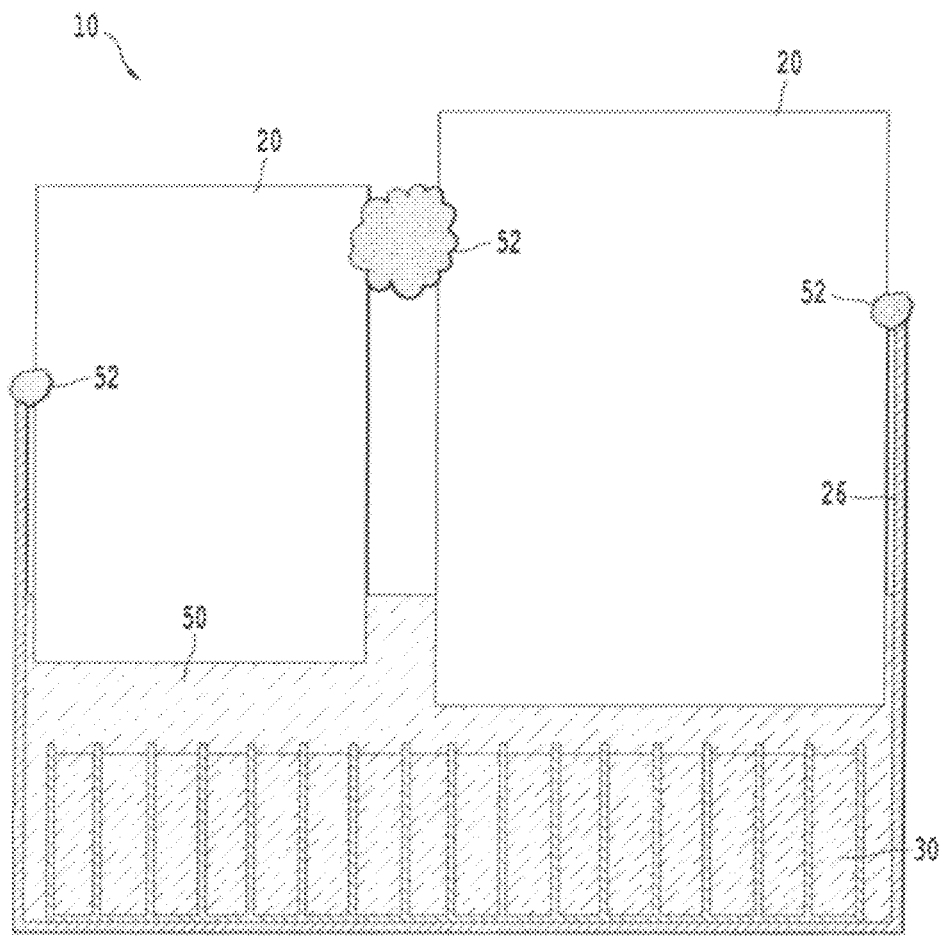
FIG. 5B is a front view of a PET detector module according to yet another example disclosed herein.

FIGS. 5A and 5B depict a pair of PET detector modules 10 in which a fixture 44 is installed. The fixture may be permanent or may be temporary and is used in the process of manufacturing the PET detector module 10 as discussed below. Additionally, FIGS. 5A and 5B depict glue 52 used to secure the PMT 20 to the tray 26. The glue 52 may be permanent or removed after complete construction of the PET detector module 10. In one embodiment, the glue 52 comprises the same material as the transparent adhesive 50.

FIG. 6 depicts a tray 26, which includes a tray main body 26b coupled to tray walls 26a. The tray main body 26b and/or the tray walls 26a may comprise aluminum, for example 1 mm thick aluminum, which is relatively transparent to gamma rays. However, other materials such as carbon fiber or various polymers may be used. Typically, the tray walls 26a are coupled to the tray main body 26b via screws or other detachable means. However, the walls 26a may be permanently attached. One benefit of making the tray walls 26a removable such as via threaded screws, magnets, clasps, snap-fittings or other such devices is that the tray walls 26a may be easily removed in order to facilitate construction of the PET detector module 10. This construction will be explained as follows. As shown in FIG. 6, the scintillation crystals 30 reside in the bottom of the tray 26. Optional reflector elements 28 may be disposed between the scintillation crystals 30 and extend in a vertical direction as shown in FIG. 6. In an alternate embodiment, the reflectors 28 rest entirely on top of the scintillation crystals 30.

Figure 7:
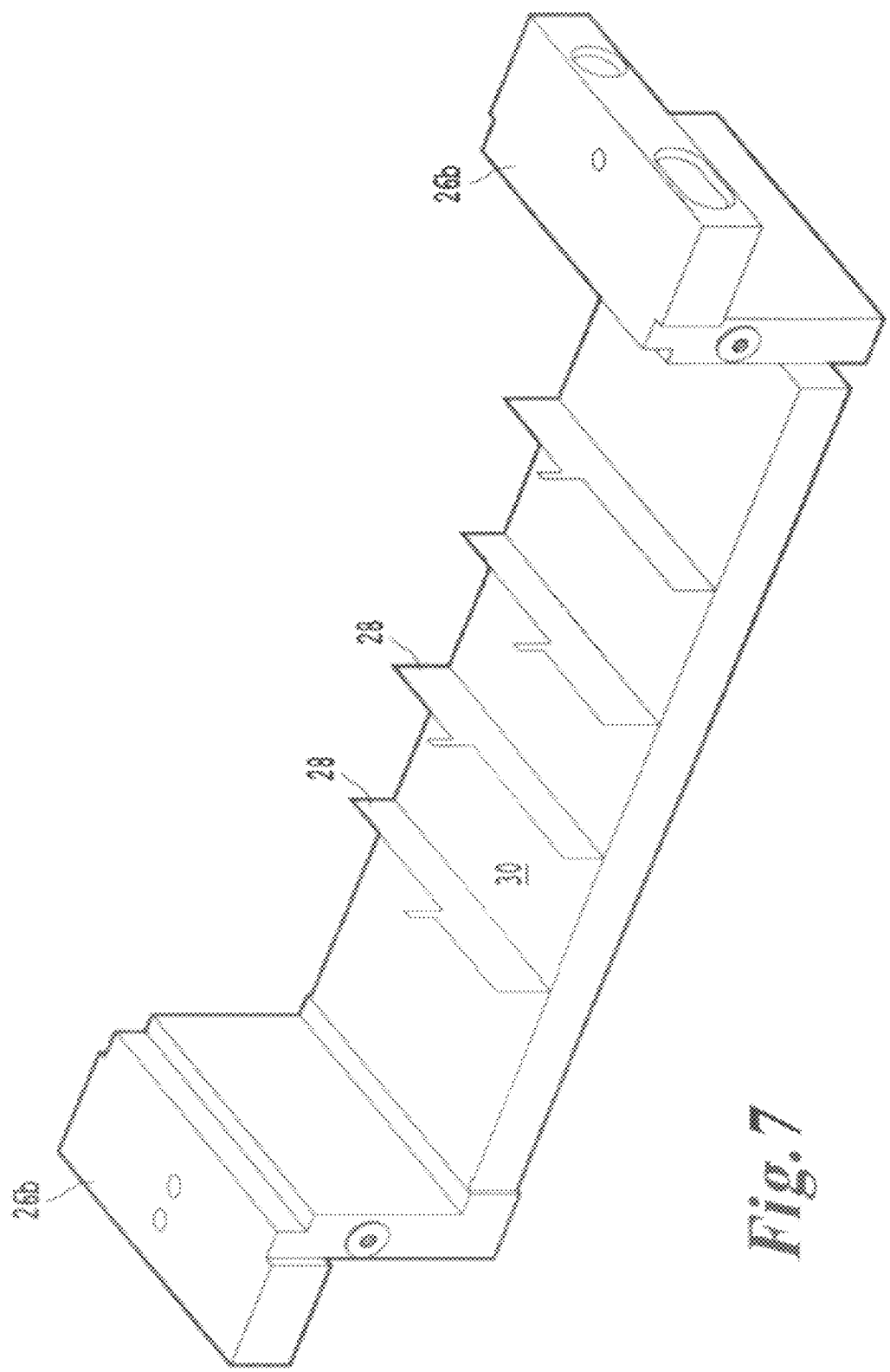
FIG. 7 is a perspective view of the tray shown in FIG. 6, but with walls removed for clarity.

FIG. 7 depicts the tray main body 26b with the tray walls 26a completely removed. As shown in FIG. 7, the tray main body 26b is typically composed of at least two separate parts, which form the ends of the tray 26 and are connected via the tray walls 26a. The first step in the assembly process is placing the scintillator crystals 30 and reflectors 28 in the tray 26 (see also FIG. 16, step S000).

Figure 8:
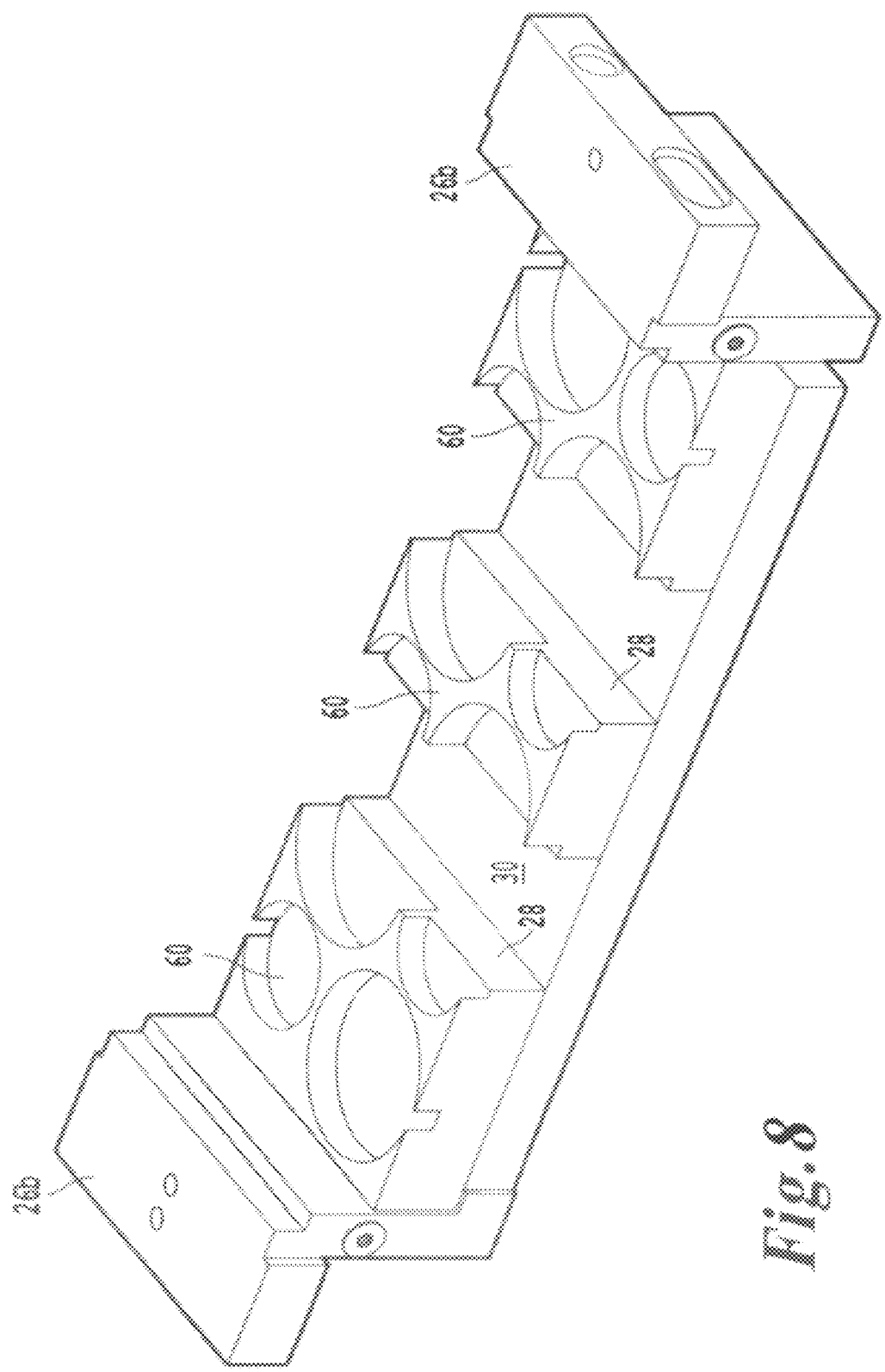
FIG. 8 is a depiction of the tray shown in FIG. 7 with spacers added to illustrate a portion of a method of construction of a PET detector module.
Figure 16:
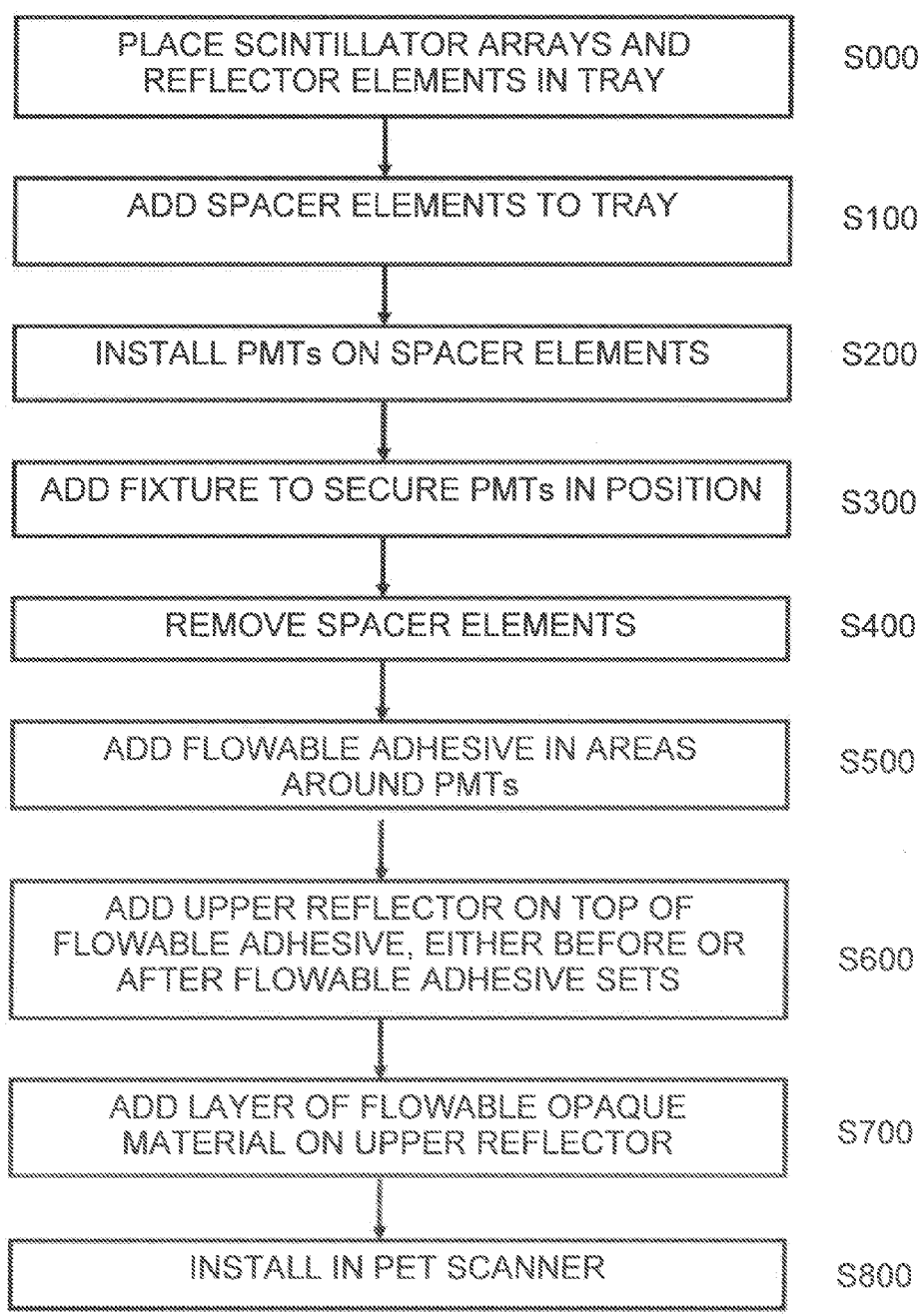
FIG. 16 is a flowchart depicting one example of a method of constructing a PET detector module according to one preferred embodiment disclosed herein.

Beginning with the arrangement shown in FIG. 8, assembly of the PET detector module 10 includes adding spacers 60 above the scintillation crystals 30 (see also FIG. 16, step S100). The spacers 60 are arranged to receive and support the PMTs 20. As shown in FIG. 8, the spacers 60 may include recesses or cavities having a shape configured to match the shape of the PMTs 20.

In the embodiment depicted in FIG. 8, the spacers 60 are arranged to hold the PMTs 20 in a vertical orientation such that the longitudinal axes of the PMTs 20 are in line with the radii of the ring. However, in some embodiments, the spacers 60 will "tilt" the PMTs such that the axes of the PMTs 20 are non-parallel to the radii of the ring.

Figure 9:
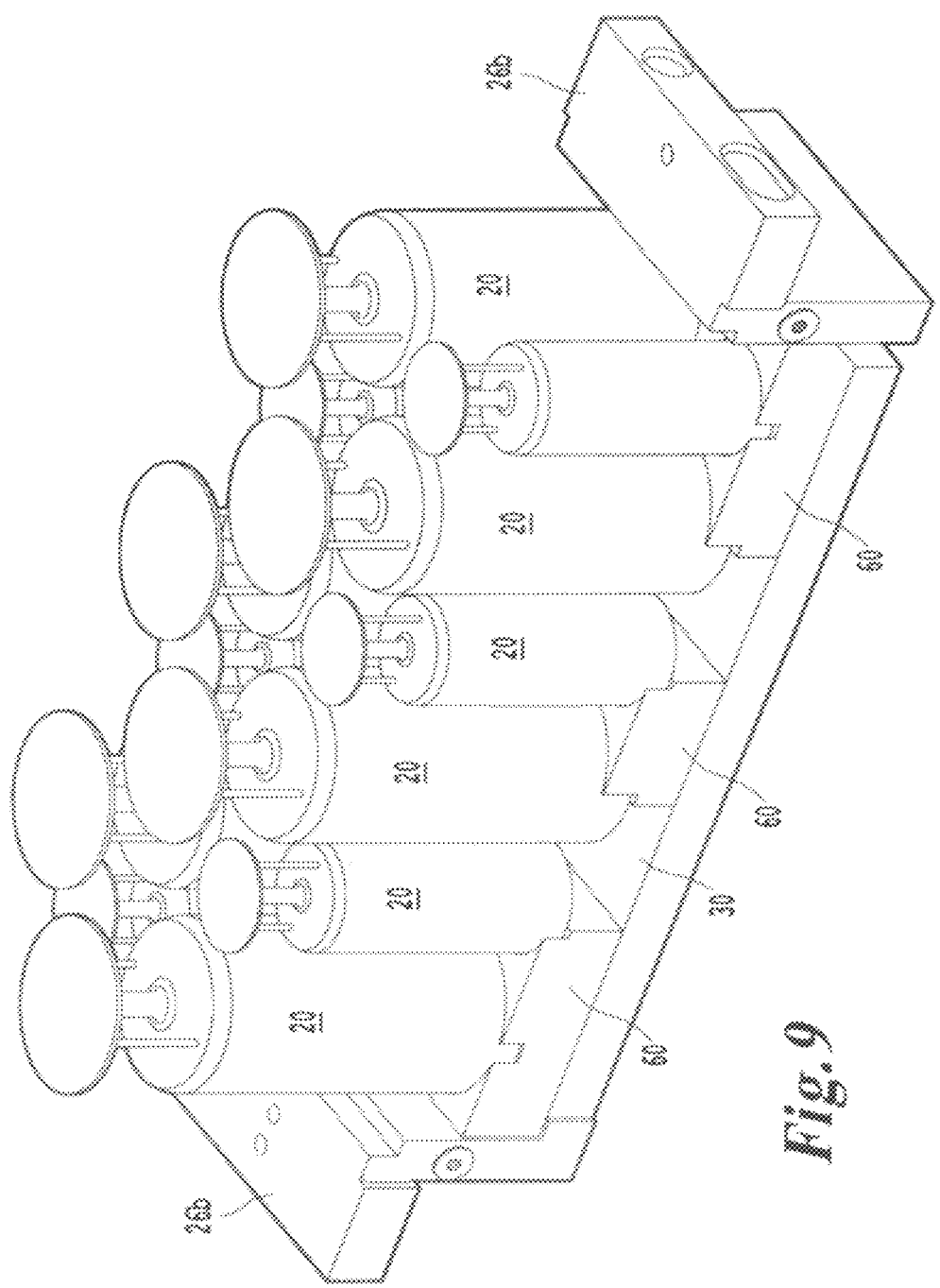
FIG. 9 depicts the result of a later step in the construction of the PET detector module in which photomultiplier tubes (PMT) are added.

FIG. 9 depicts the PMTs 20 placed on top of the spacers 60 (see also FIG. 16, step S200). Thus, a gap is established between the PMTs 20 and the scintillation crystals 30. This gap is maintained by the spacers 60. The gap, as measured in a direction parallel to the radii of the ring, may be different from one PMT 20 to the other. For example, for PMTs 20 of a first size, the gap may be a first distance (height), and for PMTs 20 of a second size different from the first size, the gap may be a second distance different from the first distance.

Figure 10:
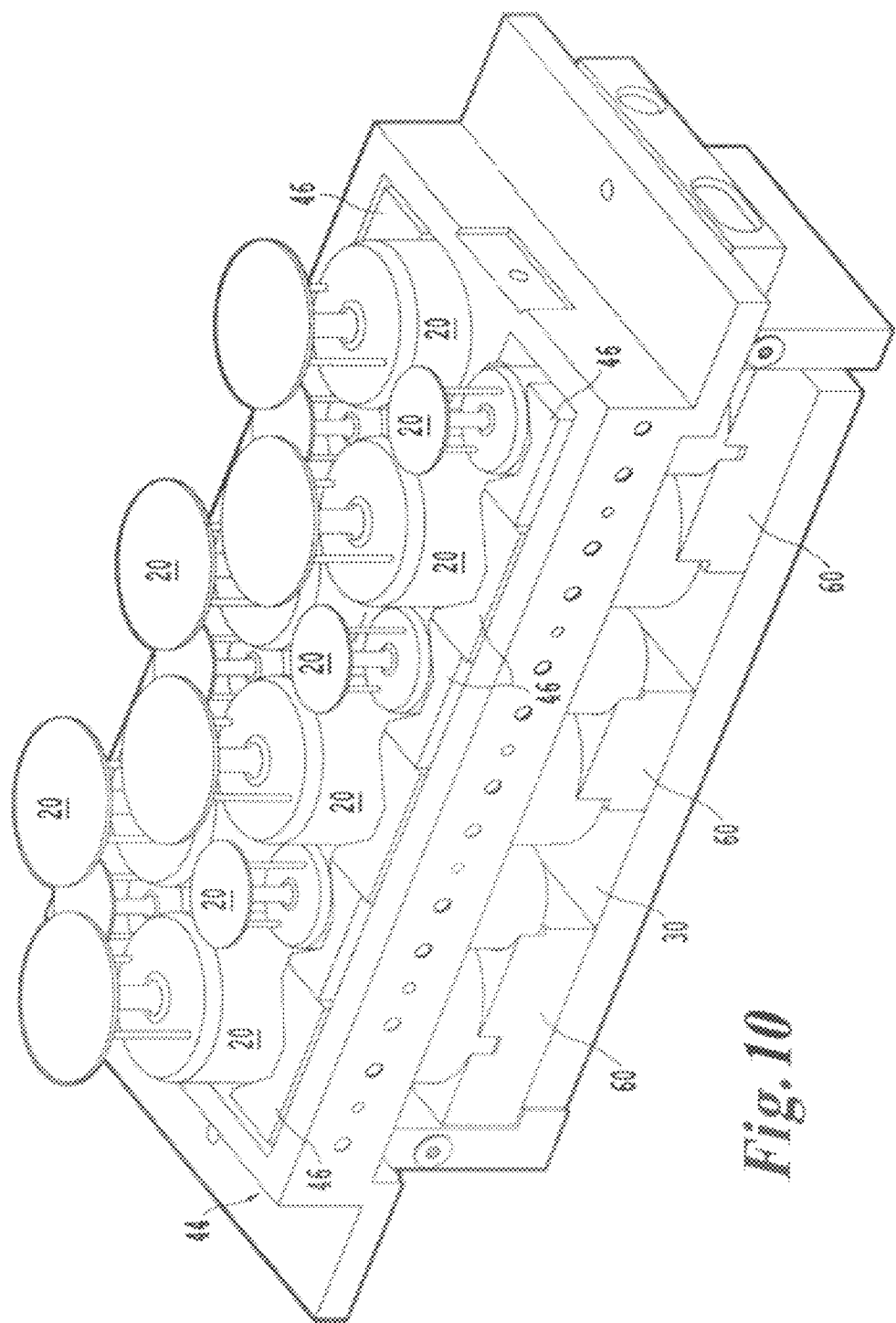
FIG. 10 depicts the construction shown in FIG. 9 with the addition of a fixture and associated optional fixture blocks.

FIG. 10 depicts the result of a subsequent step in the process of construction of a PET detector module 10 in which a fixture 44 is added to hold the PMTs 20 in place so that the spacers 60 may be removed (see also FIG. 16, steps S300-S400). Optional fixture blocks 46 further secure the PMTs 20 within the fixture 44. The optional fixture blocks 46 may have a contour or shape that accommodates an external surface of the PMTs 20.

Figure 11:
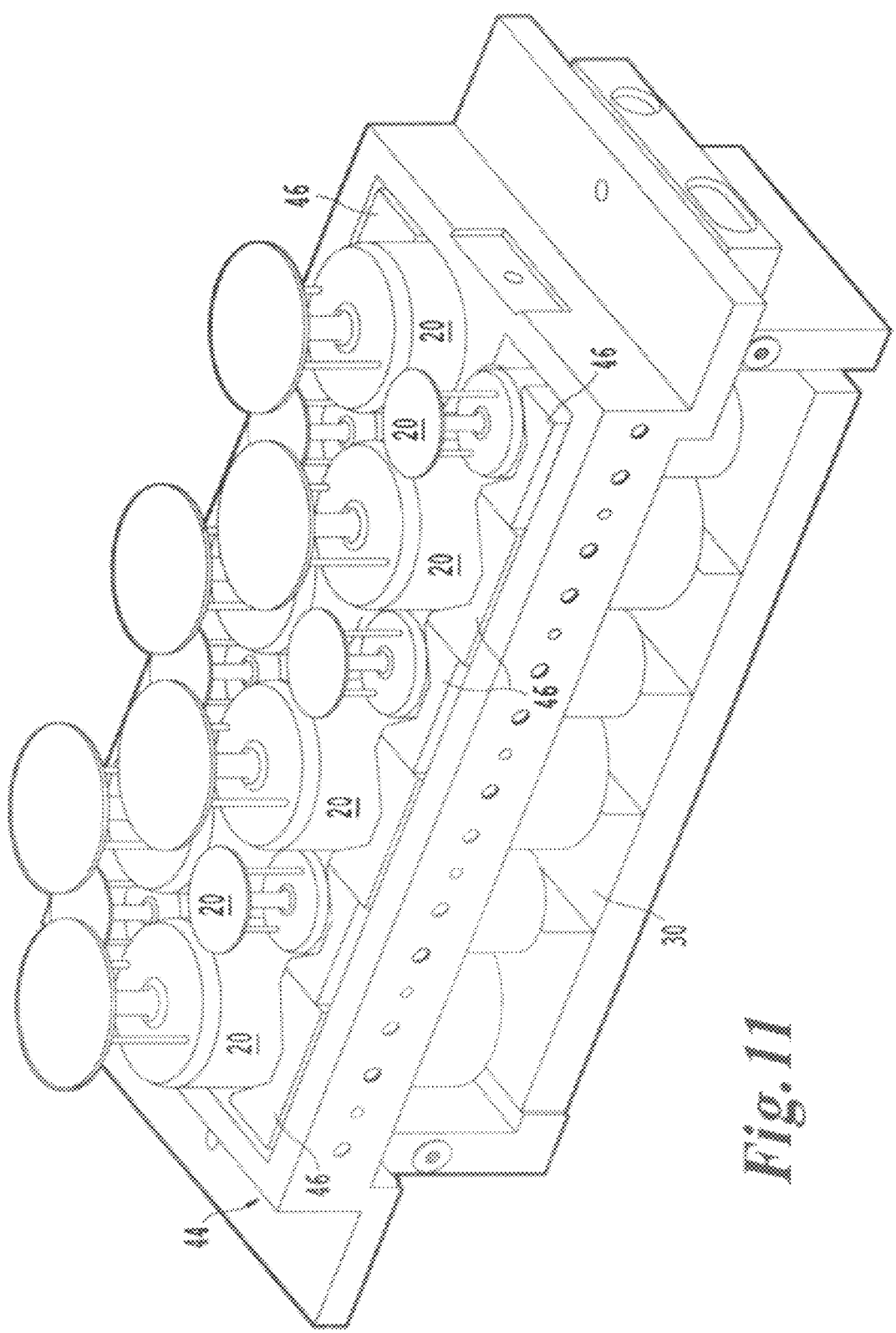
FIG. 11 depicts the result of a later step in construction of the PET detector module shown in FIG. 10 with the spacers removed.

Next, as shown in FIG. 11, the spacers 60 are removed (see also FIG. 16, step S400). In order to remove the spacers 60, the fixture 44 may be temporarily removed, and then replaced. The fixture 44 and optional fixture blocks 46 (if present) maintain the orientation of the PMTs 20 and the gap between the PMTs 20 and the scintillation crystals 30.

Next, the transparent adhesive 50 is added as set forth in FIG. 16, step S500. Typically, the transparent adhesive is liquid or semi-liquid before curing. The tray walls 26*a* will assist in holding the transparent adhesive 50 in place, should the transparent adhesive 50 be in liquid form. As noted above, the transparent adhesive 50 may be curable at room temperature, heat curable, or curable via ultraviolet light (UV).

Figure 12:
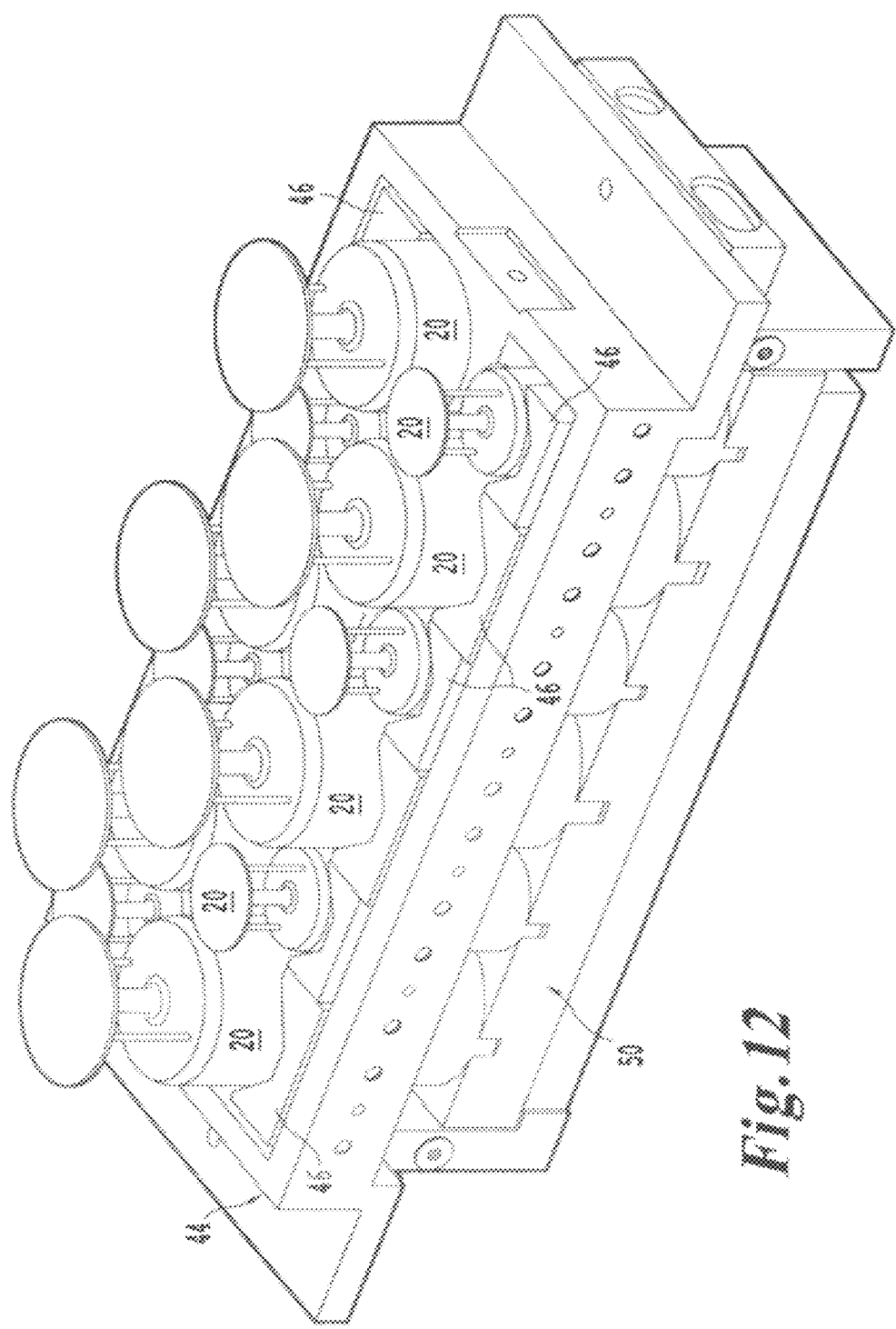
FIG. 12 depicts the result of a subsequent step in the construction of the PET detector module depicted, in partially completed form in FIG. 11, but with a transparent adhesive added.
Figure 13:
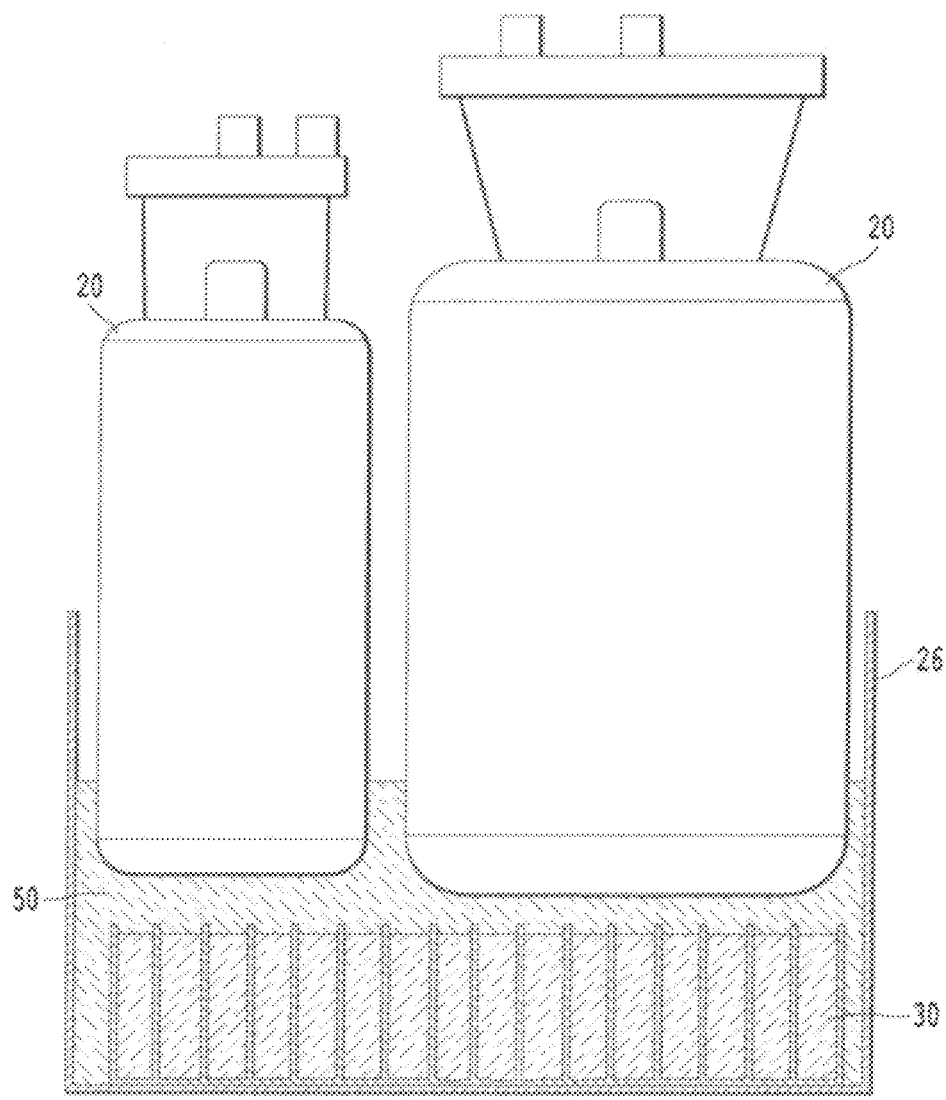
FIG. 13 is a front view of a partially completed PET detector module.

FIG. 13 depicts the arrangement shown in FIG. 12, but from a side view.

Figure 14:
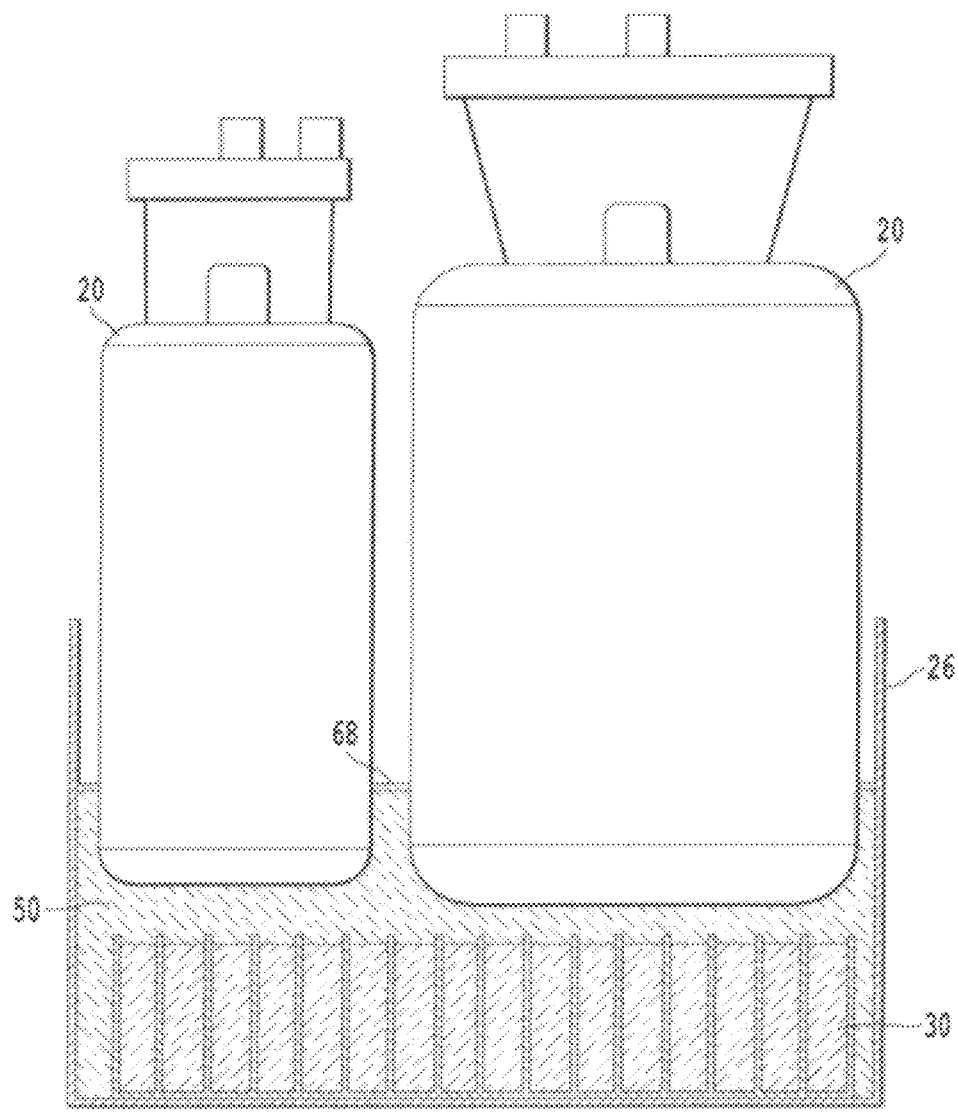
FIG. 14 depicts a result of a subsequent manufacturing step in which an upper reflector is added to the partially completed PET detector module shown in FIG. 13.

FIG. 14 depicts a subsequent and optional step in which a reflector 68 is installed on top of the transparent adhesive 50 (see also FIG. 16, step S600). The reflector 68 enhances the performance of the detector inasmuch as it allows greater collection efficiency of the light created by the gamma ray's interaction with the scintillation crystals 30.

Figure 15:
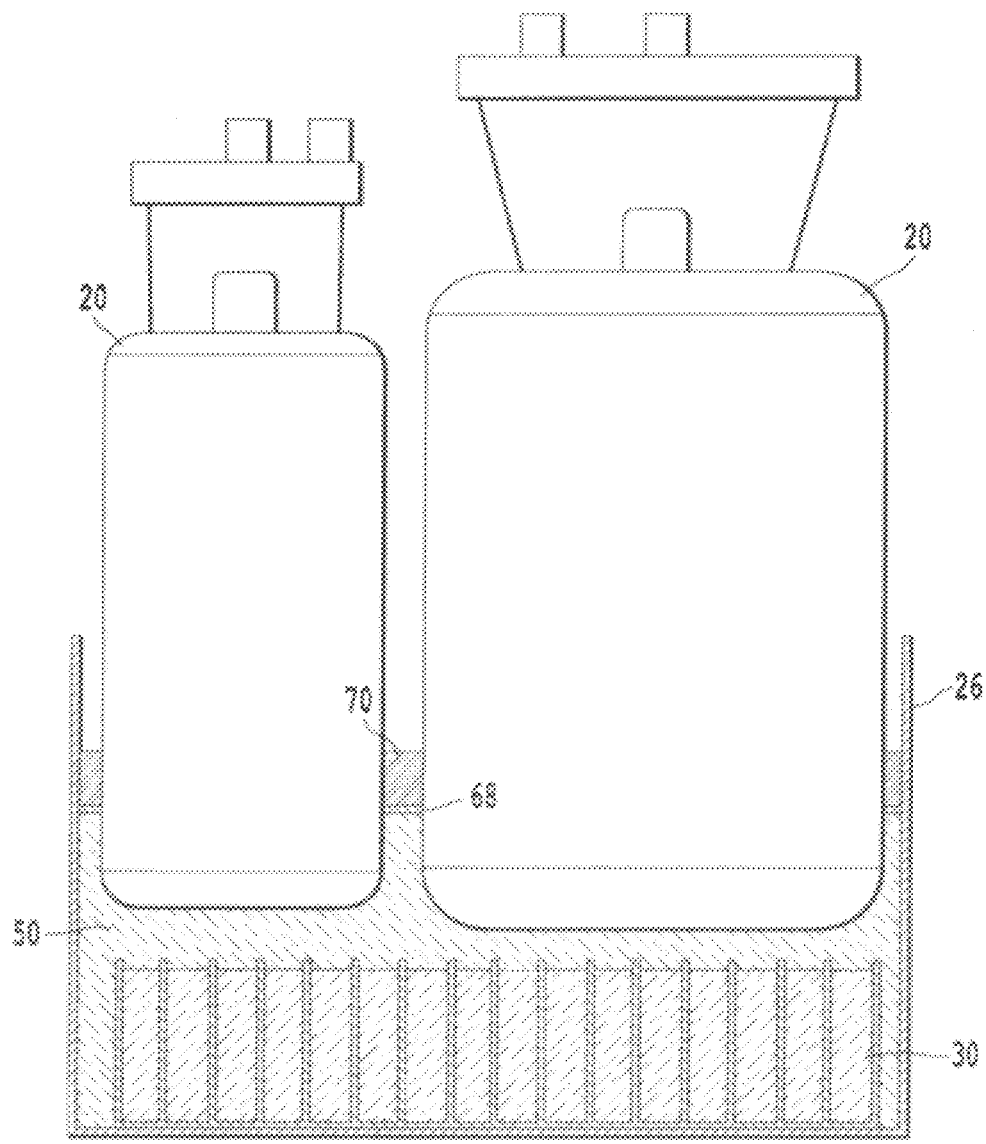
FIG. 15 shows the PET detector module of FIG. 14 with an additional component added for blocking ambient light.

FIG. 15 depicts the result of a subsequent step performed on the structure shown in FIG. 14. In the process depicted in FIG. 15, an opaque adhesive 70 is added on top of the reflector 68 (see also FIG. 16, step S700). Typically, the opaque adhesive 70 will be liquid when applied and will flow in between the PMTs 20 in order to seal the transparent adhesive 50 from ambient light external to the PET detector module 10.

The completed PET detector module is then typically installed on a PET scanner 1 as set forth in FIG. 16, step S800.

FIG. 16 is a flowchart including steps S000-S800 for manufacturing a PET module according to one embodiment disclosed herein, and steps S000-S800 are discussed with respect to the previous figures above. It is not necessary that all of steps S000-S800 be performed together or performed strictly in the order set forth in FIG. 16. Additionally, other steps may be added as necessary. For example, UV curing, heat curing, application of a vacuum, or pre-wetting of the surfaces of the PMTs 20 may be performed. In order to remove bubbles from the transparent adhesive 50, the transparent adhesive 50 may be placed under vacuum pressure for a time after the transparent adhesive 50 is discharged between the PMTs 20 and the scintillation crystals 30. Removal of such bubbles improves the uniformity and efficiency of the light sharing effect of the transparent adhesive 50.

In order to further reduce bubbles, it is beneficial to pre-wet the surfaces of the PMTs 20 before bridging the gap between the surfaces of the PMTs 20 and the surfaces of the scintillation crystals 30. The pre-wet process may be performed by dipping the PMTs 20 into adhesive 50, brushing the surfaces of the PMTs 20 with the transparent adhesive 50, spraying on the transparent adhesive 50, or other known methods of pre-wetting a surface.

While certain embodiments have been described, these embodiments have been presented by way of example only, and are not intended to limit the scope of the inventions. Indeed the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A positron emission tomography (PET) detector module, comprising:
an array of scintillation crystal elements;
a plurality of photosensors arranged to at least partially cover the array of scintillation crystal elements and configured to receive light emitted from the array of scintillation crystal elements; and
a transparent adhesive arranged between the array of scintillation crystal elements and the plurality of photosensors, the transparent adhesive extending directly from a surface of at least one of the scintillation crystal elements to a surface of at least one of the photosensors and configured to distribute the light emitted from one of the scintillation crystal elements to more than one of the plurality of photosensors,
wherein light from every one of the scintillation crystal elements in the array of scintillation crystal elements is distributed by the transparent adhesive to multiple photosensors within the plurality of photosensors.

2. The PET detector module of claim 1, wherein the at least one photosensor has a width dimension, and the transparent adhesive, as measured in a direction extending from the at least one photosensor to the at least one scintillation crystal element, has a thickness of at least 10% of a width dimension of one of the at least one photosensor.

3. The PET detector module of claim 1, wherein the at least one photosensor is cylindrical, and the transparent adhesive, as measured in a direction extending from the at least one photosensor to the at least one scintillation crystal element, has a thickness of at least 5% of a radius of a bottom surface of one of the at least one photosensor.

4. The PET detector module of claim 3, wherein the thickness of the transparent adhesive is from 90% to 100% of the radius of the bottom surface of the at least one photosensor.

5. The PET detector module of claim 1, wherein the transparent adhesive, as measured in a direction extending from the at least one photosensor to the at least one scintillation crystal element, has a thickness of at least 1 mm.

6. The PET detector module of claim 1, further comprising a tray at least partially surrounding the scintillator crystals and transparent adhesive.

7. The PET detector module of claim 6, wherein the tray comprises aluminum.

8. The PET detector module of claim 1, further comprising at least one reflector element disposed between at least two scintillation crystal elements, the at least one reflector element extending from the at least two scintillation crystal elements toward the plurality of photosensors and at least partially through the transparent adhesive.

9. The PET detector module of claim 1, further comprising an opaque material disposed on a side of the transparent adhesive opposite the scintillation crystal elements, the opaque material blocking ambient light from reaching the transparent adhesive.

10. The PET detector module of claim 9, wherein the opaque material is an opaque adhesive.

11. The PET detector module of claim 1, wherein the transparent adhesive covers the entire surface of the array of scintillation crystal elements facing the plurality of photosensors.

12. A positron emission tomography scanner system, comprising:
a plurality of detector modules arranged adjacent to one another to form a cylindrical detector ring, wherein each of the detector modules includes
an array of scintillation crystal elements;
a plurality of photosensors arranged to at least partially cover the array of scintillation crystal elements and configured to receive light emitted from the array of scintillation crystal elements; and
a transparent adhesive arranged between the array of scintillation crystal elements and the plurality of photosensors, the transparent adhesive extending directly from a surface of at least one of the scintillation crystal elements to a surface of at least one of the photosensors and configured to distribute the light emitted from one of the scintillation crystal elements to more than one of the plurality of photosensors, wherein light from every one of the scintillation crystal elements in the array of scintillation crystal elements is distributed by the transparent adhesive to multiple photosensors within the plurality of photosensors.

13. A method of manufacturing a positron emission tomography (PET) detector module, the method comprising:

disposing at least one photosensor in a position offset from an array of scintillation crystal elements so as to form a gap between the at least one photosensor and the array of scintillation elements, the gap between the at least one photosensor and the array of scintillation crystal elements being created by inserting at least one spacer between the at least one photosensor and the array of scintillation crystal elements;

securing the at least one photosensor after the at least one spacer has been inserted, and then removing the at least one spacer after the at least one photosensor has been secured; and after removing the at least one spacer, discharging a flowable transparent adhesive into the area previously occupied by the at least one spacer such that the flowable transparent adhesive extends directly from a surface of the at least one photosensor to a surface of the array of scintillation elements.

14. The method of manufacturing a PET detector module of claim 13, further comprising securing the at least one photosensor, to maintain the gap, via a fixture before said discharging the flowable transparent adhesive into the gap.

15. The method of claim 14, wherein the fixture is removed after the flowable adhesive is cured.

16. The method of claim 14, wherein the fixture is left in place to provide mechanical support for the lifetime of the detector.

17. The method of manufacturing a PET detector module of claim 13, further comprising, prior to discharging the flowable transparent adhesive into area previously occupied by the at least one spacer, prewetting the at least one photosensor with the flowable transparent adhesive.

18. The method of manufacturing a PET detector module of claim 13, further comprising reducing the air pressure above the flowable transparent adhesive after the flowable transparent adhesive has been discharged into the area previously occupied by the at least one spacer.

19. The method of manufacturing a PET detector module of claim 13, further comprising curing the flowable transparent adhesive after discharging the flowable transparent adhesive into area previously occupied by the at least one spacer.

20. The method of manufacturing a PET detector module of claim 13, further comprising discharging an opaque adhesive between the at least one photosensor and another photosensor and sealing the flowable transparent adhesive from ambient light.

* * * * *